(12) United States Patent
Zhang et al.

(10) Patent No.: US 9,606,393 B2
(45) Date of Patent: Mar. 28, 2017

(54) FABRICATION METHOD OF SUBSTRATE

(71) Applicant: BOE Technology Group Co., Ltd., Beijing (CN)

(72) Inventors: Feng Zhang, Beijing (CN); Guanbao Hui, Beijing (CN); Zhanfeng Cao, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/421,944

(22) PCT Filed: Jul. 17, 2014

(86) PCT No.: PCT/CN2014/082429
§ 371 (c)(1),
(2) Date: Feb. 16, 2015

(87) PCT Pub. No.: WO2015/085772
PCT Pub. Date: Jun. 18, 2015

(65) Prior Publication Data
US 2016/0011457 A1    Jan. 14, 2016

(30) Foreign Application Priority Data

Dec. 12, 2013 (CN) .......................... 2013 1 0681507

(51) Int. Cl.
*H01L 27/32* (2006.01)
*G02F 1/1335* (2006.01)
(Continued)

(52) U.S. Cl.
CPC .. *G02F 1/133516* (2013.01); *G02F 1/133512* (2013.01); *G02F 1/136209* (2013.01);
(Continued)

(58) Field of Classification Search
CPC ................................. H01L 21/02172
See application file for complete search history.

(56) References Cited

U.S. PATENT DOCUMENTS

2003/0030766 A1*  2/2003  Kiguchi ................ G02B 5/201
                                                          349/106
2006/0284956 A1   12/2006  Chou
(Continued)

FOREIGN PATENT DOCUMENTS

CN         1892265 A     1/2007
CN       102650757 A     8/2012
(Continued)

OTHER PUBLICATIONS

Oct. 27, 2014—English Translation of the International Search Report and the Written Opinion Appn PCT/CN2014/082429.
(Continued)

*Primary Examiner* — Cheung Lee
(74) *Attorney, Agent, or Firm* — Banner & Witcoff, Ltd.

(57) ABSTRACT

A fabrication method of a substrate, relates to a field of a display technology, which can avoid a deviation between a line width of a black matrix or a color filter layer actually fabricated and a preset line width, so that the black matrix can just completely shield thin film transistor, a data line and a gate line, and meanwhile the black matrix or the color filter layer more refined are obtained, which improves the display effect of the liquid crystal display. The fabrication method of the substrate comprises: forming a to-be-treated layer, forming a light-shielding layer on the to-be-treated layer, and forming a pattern of the light-shielding layer by a patterning process, wherein the light-shielding layer is made of metal; performing a patterning process on the to-be-treated layer by using the pattern of the light-shielding layer as a mask; and removing the light-shielding layer.

18 Claims, 2 Drawing Sheets

(51) Int. Cl.
  H01L 21/027    (2006.01)
  H01L 51/50     (2006.01)
  H01L 27/12     (2006.01)
  G02F 1/1362    (2006.01)

(52) U.S. Cl.
  CPC ...... *H01L 21/0274* (2013.01); *H01L 27/1288* (2013.01); *H01L 27/3295* (2013.01); *H01L 51/5012* (2013.01); *G02F 2001/136222* (2013.01)

(56) References Cited

U.S. PATENT DOCUMENTS

| | | | | |
|---|---|---|---|---|
| 2009/0253051 | A1* | 10/2009 | Kim | G03F 1/32 430/5 |
| 2011/0031517 | A1* | 2/2011 | Huang | H01L 29/78633 257/98 |
| 2011/0108715 | A1* | 5/2011 | Chen | H01L 27/14621 250/227.2 |

FOREIGN PATENT DOCUMENTS

| | | |
|---|---|---|
| CN | 103353699 A | 10/2013 |
| CN | 103646852 A | 3/2014 |
| JP | 2005134879 A | 5/2005 |

OTHER PUBLICATIONS

Sep. 30, 2015—First Office Action Appn 201310681507.3 with Eng Tran.

International Search Report and Written Opinion mailed Oct. 27, 2014 (PCT/CN2014/082429): ISA/CN.

Jun. 14, 2016—International Preliminary Report on Patentability Appn PCT/CN2014/082429.

May 5, 2016—(CN)—Second Office Action Appn 201310681507.3 with English Tran.

Yu Zhao et al., Aluminium Mask Process for Manufacturing Polymer Guiding Wave "Semiconductor Optoelectronics", vol. 26, Issue 3, Jun. 2005.

* cited by examiner

FABRICATION METHOD OF SUBSTRATE

The application is a U.S. National Phase Entry of International Application No. PCT/CN2014/082429 filed on Jul. 17, 2014, designating the United States of America and claiming priority to Chinese Patent Application No. 201310681507.3 filed on Dec. 12, 2013. The present application claims priority to and the benefit of the above-identified applications and the above-identified applications are incorporated by reference herein in their entirety.

TECHNICAL FIELD

Embodiments of the invention relate to a fabrication method of a substrate.

BACKGROUND

A liquid crystal display is a thin flat display device, having a structure mainly including an array substrate, a color filter substrate, and a liquid crystal molecule layer located between the array substrate and the color filter substrate. The array substrate mainly has thin film transistors arranged in an array, data lines and gate lines disposed thereon; and the color filter substrate mainly has a black matrix and a color filter layer disposed thereon. A main function of the black matrix is to shield the thin film transistors, the data lines and the gate lines disposed on the array substrate, so that the liquid crystal display has a good display effect, and therefore the black matrix should have a suitable line width, in order to just completely shield the thin film transistors, the data lines and the gate lines. In addition, in order to achieve a better shielding effect, structures such as the black matrix and the color filter layer may be directly disposed on the array substrate, wherein the black matrix is located above the thin film transistors arranged in an array, the data lines and the gate lines.

The above description indicates that an accurate setting of the line width of the black matrix has a great influence on a display effect of the liquid crystal display. The inventors find that, when an actual exposing process is being performed, there is a certain gap between a mask and the black matrix or the color filter layer substrate, the gap leading to a deviation between the line width of the black matrix or the color filter layer actually fabricated and a line width of a corresponding pattern on the mask used thereby. This deviation leads to inconsistency between the line width of the black matrix actually fabricated and the preset line width, so that the black matrix cannot just completely shield the thin film transistors, the data lines and the gate lines, which worsens the display effect of the liquid crystal display.

SUMMARY OF THE INVENTION

An embodiment of the present invention provides a fabrication method of a substrate, using a technical solution as follows:

A fabrication method of a substrate, comprises:

Forming a to-be-treated layer, forming a light-shielding layer on the to-be-treated layer, and forming a pattern of the light-shielding layer by a patterning process;

Performing a patterning process on the to-be-treated layer by using the pattern of the light-shielding layer as a mask;

Removing the light-shielding layer.

In one example, the light-shielding layer is made of a metal.

The to-be-treated layer is of a black photosensitive resin, and after the patterning process is performed on the to-be-treated layer by using the pattern of the light-shielding layer as a mask, the to-be-treated layer is formed into a black matrix.

In one example, in the fabrication method of the substrate, the substrate is a color filter substrate, and the fabrication method further comprises:

Forming a color filter layer on the substrate;

Forming a transparent protective layer, on the black matrix and the color filter layer formed.

In one example, the to-be-treated layer is of a color photosensitive resin, and after the patterning process is performed on the to-be-treated layer by using the pattern of the light-shielding layer as a mask, the to-be-treated layer is formed into a color filter layer.

In one example, in the fabrication method of the substrate, the substrate is a color filter substrate, and the fabrication method further comprises:

Forming a black matrix on the substrate;

Forming a transparent protective layer on the black matrix and the color filter layer formed.

In one example, in the fabrication method of the substrate, the substrate is an array substrate, and before forming the to-be-treated layer, forming the light-shielding layer on the to-be-treated layer, and forming the pattern of the light-shielding layer by a patterning process, it further comprises:

Forming a gate electrode metal layer on a base substrate, and forming a pattern including a gate line and a gate electrode by a patterning process;

Forming a gate electrode insulating layer, on the formed pattern including the gate line and the gate electrode;

Forming a semiconductor thin film, and forming a pattern including an active layer by a patterning process, on the gate electrode insulating layer formed;

Forming a source electrode metal layer, and forming a pattern including a data line and a source electrode by a patterning process, on the formed pattern including the active layer;

Forming a passivation layer, on the formed pattern including the data line and the source electrode.

In one example, the fabrication method of the substrate, after the removing the light-shielding layer, further comprises:

Forming a via hole corresponding to a drain electrode, on the black matrix and the passivation layer formed;

Forming a transparent conductive layer, and forming a pattern including a pixel electrode by a patterning process, the pixel electrode being electrically connected with the drain electrode through the via hole.

In one example, the light-shielding layer is removed by using an etching method.

An embodiment of the present invention provides a fabrication method of the substrate as described above. The patterned light-shielding layer on the to-be-treated layer serves as the mask during an exposing process for the to-be-treated layer, so that there is no gap between the mask and the to-be-treated layer, and furthermore, a size of the pattern of the to-be-treated layer fabricated is consistent with a preset size. When the to-be-treated layer is of the black photosensitive resin or the color photosensitive resin, the line width of the black matrix or the color filter layer on the substrate fabricated by the above-described method is consistent with the preset line width, and thus the black matrix can just completely shield the thin film transistor, the data line and the gate line, which improves the display effect of the liquid crystal display, and meanwhile reduces the energy consumption and cost.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

First Embodiment

The embodiment of the present invention provides a fabrication method of a substrate, the fabrication method comprising:

Step S101: forming a to-be-treated layer, forming a light-shielding layer on the to-be-treated layer, and forming a pattern of the light-shielding layer by a patterning process.

Step S102: performing a patterning process on the to-be-treated layer by using the pattern of the light-shielding layer as a mask.

Step S103: removing the light-shielding layer.

In order to meet requirements of a good light shielding effect and accurately transference of the pattern of the mask at the same time, the light-shielding layer in the embodiment of the present invention is made of, for example, a metal.

The embodiment of the present invention provides a fabrication method of the substrate as described above. The patterned light-shielding layer on the to-be-treated layer serves as the mask during an exposing process for the to-be-treated layer, so that there is no gap between the mask and the to-be-treated layer, and furthermore, a size of the pattern of the to-be-treated layer fabricated is consistent with a preset size. When the to-be-treated layer is of the black photosensitive resin or the color photosensitive resin, the line width of the black matrix or the color filter layer on the substrate fabricated by the above-described method is consistent with the preset line width, and thus the black matrix can just completely shield the thin film transistor, the data line and the gate line, which improves the display effect of the liquid crystal display, and meanwhile reduces the energy consumption and cost.

Figure 1:
FIG. 1 is a schematic diagram I of a fabrication process of a substrate in an embodiment of the present invention.

Specifically, the above-described fabrication method may be described as follows:

Firstly, as illustrated in FIG. 1, a to-be-treated layer 2 is formed on a base substrate 1. It should be noted that, in an actual situation, other structures may be disposed between the base substrate 1 and the to-be-treated layer 2, which will not be limited by the embodiment of the present invention. The base substrate 1 may be a glass substrate, a quartz substrate and other substrates with a good light transmittance.

Figure 2:
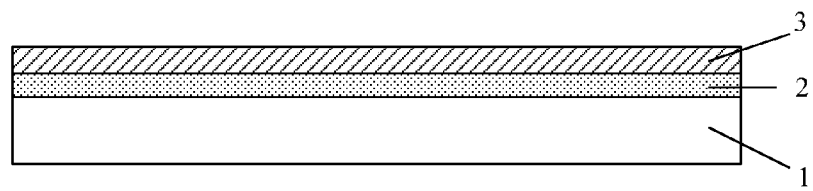
FIG. 2 is a schematic diagram II of a fabrication process of a substrate in an embodiment of the present invention.

Secondly, as illustrated in FIG. 2, a light-shielding layer 3 is formed on the to-be-treated layer 2. In the embodiment of the present invention, the light-shielding layer 3 is made of, for example, a metal, which may be molybdenum, aluminum, copper and other metals, and a thickness thereof may be 200~3,000 angstroms, but the material of the light-shielding layer 3 is not limited to a metal, and all the other light-shielding materials that can well transfer the pattern of the mask can be used as the light-shielding layer 3.

Figure 3:
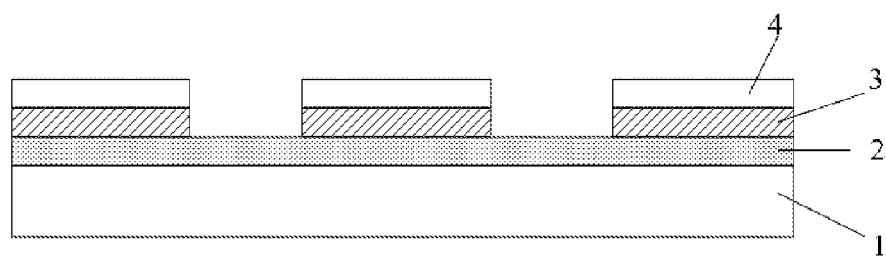
FIG. 3 is a schematic diagram III of a fabrication process of a substrate in an embodiment of the present invention.

Thirdly, the light-shielding layer 3 is coated with photoresist 4, and is exposed by using a mask; and after the steps such as developing and etching, a pattern of the light-shielding layer 3 as illustrated in FIG. 3 is formed, wherein the pattern of light-shielding layer 3 is covered with the photoresist 4.

Figure 4:
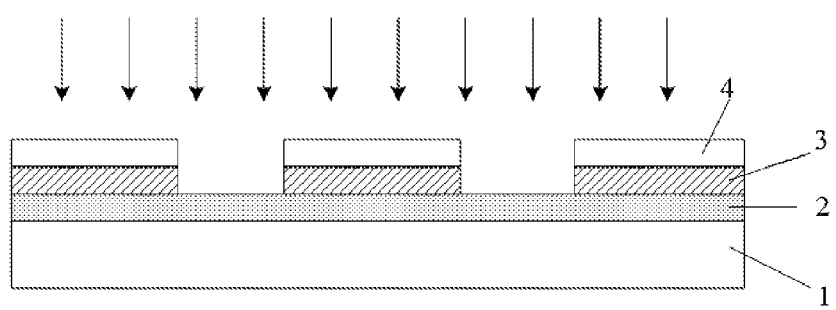
FIG. 4 is a schematic diagram IV of a fabrication process of a substrate in an embodiment of the present invention.

Then, as illustrated in FIG. 4, the to-be-treated layer 2 is exposed by using the pattern of the light-shielding layer 3 as a mask, and after the processes such as developing and etching, the exposed portion of the to-be-treated layer 2 is removed.

Figure 5:
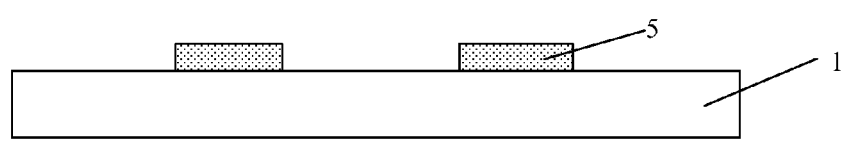
FIG. 5 is a schematic diagram V of a fabrication process of a substrate in an embodiment of the present invention.

Finally, the light-shielding layer 3 and the photoresist 4 are removed, to form a patterned to-be-treated layer 5 as illustrated in FIG. 5, and usually the light-shielding layer 3 is removed by an etching method. In the embodiment of the present invention, preferably, the photoresist 4 is removed while the patterned light-shielding layer 3 is removed, or the photoresist 4 may be removed directly after the pattern of the light-shielding layer 3 is formed, and then the to-be-treated layer 2 is exposed by using the patterned light-shielding layer 3 which is not covered by the photoresist 4 as a mask, which will not be limited by the embodiment of the present invention.

It should be noted that, the to-be-treated layer 2 may be made of the material required by various structures on the substrate, which will not be limited by the embodiment of the present invention. Exemplarily, the to-be-treated layer 2 may be made of a black photosensitive resin, and then after the patterning process is performed on the to-be-treated layer 2 by using the pattern of the light-shielding layer 3 as a mask, the to-be-treated layer 2 is formed into a black matrix 5; the to-be-treated layer 2 may also be made of a color photosensitive resin, and then after the patterning process is performed on the to-be-treated layer 2 by using the pattern of the light-shielding layer 3 as a mask, the to-be-treated layer 2 is formed into a color filter layer 6. The color filter layer includes a red region, a green region and a blue region; and the fabrication process of each region may include the above-described fabrication method provided by the embodiment of the present invention.

Second Embodiment

Figure 6:
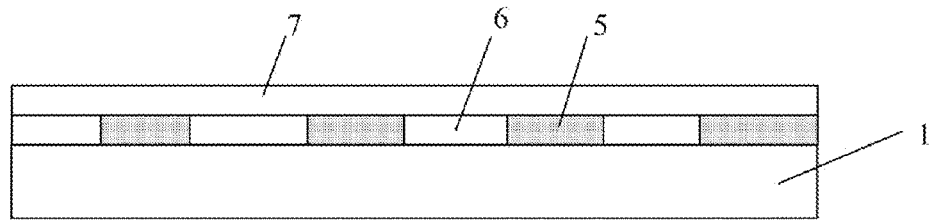
FIG. 6 is a schematic diagram of a color filter substrate in an embodiment of the present invention.

Specifically, when the to-be-treated layer 2 is of a black photosensitive resin, and the substrate is a color filter substrate, as illustrated in FIG. 6, the color filter substrate mainly includes a base substrate 1, a black matrix 5 and a color filter layer 6, a transparent protective layer 7 and other structures disposed sequentially. The fabrication method further comprises:

Step S801: forming a color filter layer on the substrate.

As illustrated in FIG. 6, the color filter layer 6 may be made of a color photosensitive resin; the color filter layer 6 includes a red region, a green region and a blue region; and each region is made of the selected color photosensitive resin in a corresponding color.

The color filter layer 6 may be formed on the substrate by using methods such as inkjet printing, pigment dispersing and printing. Because the color filter layer 6 includes the red region, the green region and the blue region, it should be formed three times respectively. Exemplarily, the red region is formed firstly, a layer of a red photosensitive resin should be coated on the substrate, covered by the corresponding mask, exposed and developed to obtain the red region; and then the green region is formed, with a green photosensitive resin coated on the entire substrate, covered by the corresponding mask, exposed and developed to obtain the green region; and finally the blue region is formed, with a blue photosensitive resin coated on the entire substrate, covered by the corresponding mask, exposed and developed to obtain the blue region. Through the above-described process, the color filter layer 6 including the red region, the green region and the blue region is formed on the entire substrate.

It should be noted that, the color filter layer 6 may be prepared by using the above-described methods in the prior art, or by using the fabrication method provided by the embodiment of the present invention. In order to ensure consistency between the line width of the black matrix 5 fabricated and the pre-designed line width, if the color filter layer 6 is fabricated by using the prior art, then the color filter layer 6 may be fabricated after the black matrix 5 is formed; and if the color filter layer 6 is fabricated by using the method in the embodiment of the present invention, then the color filter layer 6 may be fabricated after the black matrix 5 is formed, or before the black matrix 5 is formed, which will not be limited by the embodiment of the present invention.

Step S802: forming a transparent protective layer, on the black matrix and the color filter layer formed.

A transparent protective layer 7 may be formed on the black matrix 5 and the color filter layer 6 by depositing, coating, etc. In general, a material selected for the transparent protective layer 7 is preferably a polymer material of an epoxy resin system and an acrylic resin system.

In addition, a transparent conductive film may be formed on the transparent protective layer 7 by depositing, sputtering, coating, etc. In general, a material selected for the transparent conductive film may be a transparent conductive material such as indium tin oxide or indium zinc oxide. The transparent conductive film may be set according to actual needs of the liquid crystal display; exemplarily, when an ADvanced Super Dimension Switch technology is used for the liquid crystal display, it is not necessary to provide the transparent conductive film on the color filter substrate.

Third Embodiment

When the to-be-treated layer 2 is the color photosensitive resin, and the substrate is the color filter substrate illustrated in FIG. 6, since the color filter layer 6 includes the red region, the green region and the blue region, in the fabrication process, the fabrication method in the first embodiment may be repeated for three times, so as to fabricate the entire color filter layer 6. The fabricated line width of the color filter layer 6 is consistent with the pre-designed line width, and then the line width of the black matrix 5 fabricated may also be consistent with the pre-designed line width. The fabrication method further comprises:

Step S901: forming a black matrix on the substrate.

The black matrix 5 is preferably made of a black photosensitive resin, and the black matrix may be formed on the substrate by using the methods such as inkjet printing, pigment dispersing and printing. Exemplarily, a layer of the black photosensitive resin may be coated on the substrate, which then is covered with the mask having a desired pattern, and after ultraviolet exposure and development, the black matrix 5 is formed on the substrate.

It should be noted that, the black matrix 5 may be prepared by using the above-described methods in the prior art, or by using the fabrication method provided by the embodiment of the present invention. In order to ensure consistency between the line width of the black matrix 5 fabricated and the pre-designed line width, if the black matrix 5 is fabricated by using the prior art, then the black matrix 5 may be fabricated after the color filter layer 6 is formed; and if the black matrix 5 is fabricated by using the method in the embodiment of the present invention, then the black matrix 5 may be fabricated after the color filter layer 6 is formed, or before the color filter layer 6 is formed, which will not be limited by the embodiment of the present invention.

Step S902: forming the transparent protective layer, on the black matrix and the color filter layer formed.

A transparent protective layer 7 may be formed on the black matrix 5 and the color filter layer 6 by depositing, coating, etc. In general, a material selected for the transparent protective layer 7 is preferably a polymer material of an epoxy resin system and an acrylic resin system.

In addition, a transparent conductive film may be formed on the transparent protective layer 7 by depositing, sputtering, coating, etc. In general, a material selected for the transparent conductive film may be a transparent conductive material such as indium tin oxide or indium zinc oxide. The transparent conductive film may be set according to actual needs of the liquid crystal display; exemplarily, when an ADvanced Super Dimension Switch technology is used for the liquid crystal display, it is not necessary to provide the transparent conductive film on the color filter substrate.

Fourth Embodiment

Figure 7:
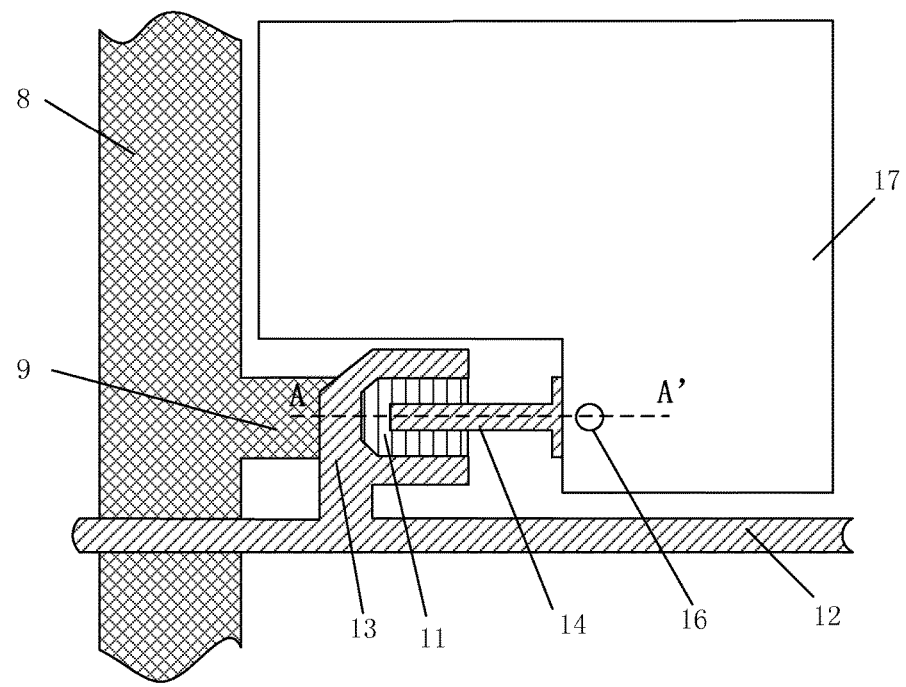
FIG. 7 is a plan schematic diagram of an array substrate in an embodiment of the present invention.
Figure 8:
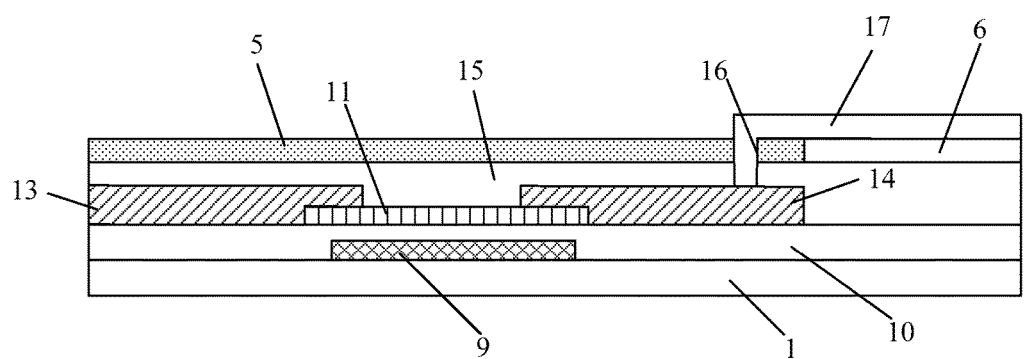
FIG. 8 is a cross-sectional schematic diagram of the array substrate in FIG. 7 in an A-A' direction in an embodiment of the present invention.

When the to-be-treated layer 2 is of a black photosensitive resin or a color photosensitive resin, and the substrate is an array substrate, a color filter on array (COA) technology is used for the color filter layer. Specifically as illustrated in FIG. 7 and FIG. 8, the array substrate mainly includes a base substrate 1, a gate line 8 and a gate electrode 9, a gate electrode insulating layer 10, an active layer 11, a data line 12 and a source electrode 13, as well as a drain electrode 14, a passivation layer 15, a black matrix 5 and a color filter layer 6 (in order to clearly show other structures, the black matrix 5 and the color filter layer 6 are not illustrated in FIG. 7), a pixel electrode 17, and other structures disposed sequentially. Thus, before forming the to-be-treated layer 2, forming the light-shielding layer 3 on the to-be-treated layer 2, and forming the pattern of the light-shielding layer 3 by a patterning process, the fabrication method further comprises:

Step S1201: forming a gate electrode metal layer on the base substrate, and forming a pattern including the gate line and the gate electrode by a patterning process.

Firstly, as illustrated in FIG. 7 and FIG. 8, a gate electrode metal layer is formed on the base substrate 1 by the methods such as sputtering and thermal evaporation. Before the gate electrode metal layer is formed, a buffer layer may be formed on the base substrate 1.

Secondly, the gate electrode metal layer is coated with a layer of photoresist, covered by using the mask having a pattern corresponding to the gate line 8 and the gate electrode 9, and then exposed, developed and etched, and finally the photoresist is removed, to form the pattern including the gate line 8 and the gate electrode 9.

Step S1202: forming a gate electrode insulating layer, on the formed pattern including the gate line and the gate electrode.

The gate electrode insulating layer 10 is formed on the pattern including the gate line 8 and the gate electrode 9 by a method such as plasma enhanced chemical vapor deposition.

Step S1203: forming a semiconductor thin film, and forming the pattern including the active layer by a patterning process, on the gate electrode insulating layer formed.

Firstly, the semiconductor thin film may be formed on the gate electrode insulating layer 10 by the method such as sputtering.

Secondly, the semiconductor thin film is coated with a layer of photoresist, and then covered by using the mask having a pattern corresponding to the active layer 11, exposed, developed and etched, and finally the photoresist is removed, to form the pattern including the active layer 11.

Step S1204: forming a source electrode metal layer, and forming a pattern including the data line and the source electrode by a patterning process, on the formed pattern including the active layer.

Firstly, the source-electrode metal layer may be formed on the pattern including the active layer 11 by the methods such as sputtering and thermal evaporation.

Secondly, the formed source-electrode metal layer is coated with a layer of photoresist, and then covered by using the mask having a pattern corresponding to the data line 12 and the source electrode 13, exposed, developed and etched, and finally the photoresist is removed, to form the pattern including the data line 12 and the source electrode 13, and meanwhile, the drain electrode 14 may be formed.

Step S1205: forming a passivation layer, on the formed pattern including the data line and the source electrode.

The passivation layer 15 may be formed on the pattern including the data line 12 and the source electrode 13 by the method such as plasma enhanced chemical vapor deposition.

The array substrate after steps S1201~S1205 mainly includes the base substrate 1, the gate line 8 and the gate electrode 9, the gate electrode insulating layer 10, the active layer 11, the data line 12 and the source electrode 13 as well as the drain electrode 14 and the passivation layer 15. Then the black matrix 5 and the color filter layer 6 are fabricated on the array substrate.

When the to-be-treated layer 2 is of a black photosensitive resin, firstly, the black matrix 5 may be formed on the passivation layer 15 by using the fabrication method provided by the embodiment of the present invention, and then the color filter layer 6 is fabricated by using the fabrication method provided by the embodiment of the present invention or the method of the prior art; or firstly the color filter layer 6 is formed on the passivation layer 15 by using the fabrication method provided by the embodiment of the present invention, and then the black matrix 5 is fabricated by using the fabrication method provided by the embodiment of the present invention. When the to-be-treated layer 2 is of a color photosensitive resin, the fabrication method of the black matrix 5 and the color filter layer 6 is similar to that described above, which will not be repeated in the embodiment of the present invention.

When the substrate is an array substrate, and the to-be-treated layer 2 is of the black photosensitive resin or the color photosensitive resin, after the above-described fabrication process, the formed array substrate mainly includes the base substrate 1, the gate line 8 and the gate electrode 9, the gate electrode insulating layer 10, the active layer 11, the data line 12 and the source electrode 13 as well as the drain electrode 14, the passivation layer 15, the black matrix 5 and the color filter layer 6. Therefore, the fabrication method, after removing the light-shielding layer 3, further comprises steps of:

Step S1301: forming a via hole corresponding to a drain electrode, on the black matrix and the passivation layer formed.

The black matrix and the passivation layer 15 are covered by using the mask having the pattern including the via hole 16, and after the steps such as exposing, developing and etching, the photoresist is removed, to form the via hole corresponding to the drain electrode 14 in corresponding positions of the black matrix and the passivation layer 15.

Step S1302: forming a transparent conductive layer, and forming a pattern including the pixel electrode by a patterning process, the pixel electrode being electrically connected with the drain electrode through the via hole.

Firstly, the transparent conductive layer may be formed by the method such as sputtering.

Secondly, the formed transparent conductive layer is coated with a layer of photoresist, and then covered by using the mask having a pattern corresponding to the pixel electrode 17, exposed, developed and etched, and finally the photoresist is removed, to form the pattern including the pixel electrode 17. The pixel electrode 17 is electrically connected with the drain electrode 14 through the via hole 16.

It should be noted that, if the ADvanced Super Dimension Switch technology is used for the liquid crystal display, the structure and the fabrication method of the above-described array substrate will change accordingly; in addition, the array substrate may also be an array substrate of other structures, such as a top-gate-type array substrate, and the fabrication method will also change accordingly, which will not be limited by the embodiment of the present invention.

The foregoing embodiments merely are exemplary embodiments of the invention, and not intended to define the scope of the invention, and the scope of the invention is determined by the appended claims.

The present application claims priority of Chinese Patent Application No. 201310681507.3 filed on Dec. 12, 2013, the disclosure of which is incorporated herein by reference in its entirety as part of the present application.

What is claimed is:

1. A fabrication method of a substrate, comprising:
    forming a to-be-treated layer, forming a light-shielding layer on the to-be-treated layer, and forming a pattern of the light-shielding layer by a first patterning process;
    performing a second patterning process on the to-be-treated layer by using the pattern of the light-shielding layer as a mask; and removing the light-shielding layer,
wherein the to-be-treated layer is of a black photosensitive resin, the fabrication method further comprising:
after the second patterning process is performed on the to-be-treated layer by using the pattern of the light-shielding layer as a mask, forming the to-be-treated layer into a black matrix.

2. The fabrication method of the substrate according to claim 1, wherein the substrate is a color filter substrate, and the fabrication method further comprises:
forming a color filter layer on the substrate; and
forming a transparent protective layer on the black matrix and the color filter layer.

3. The fabrication method of the substrate according to claim 1, wherein the substrate is an array substrate,
before the forming the to-be-treated layer, the forming the light-shielding layer on the to-be-treated layer, and the forming the pattern of the light-shielding layer by the first patterning process,
the fabrication method further comprising:
forming a gate electrode metal layer on a base substrate, and forming a pattern including a gate line and a gate electrode by a third patterning process;
forming a gate electrode insulating layer, on the formed pattern including the gate line and the gate electrode;
forming a semiconductor thin film, and forming a pattern including an active layer by a fourth patterning process, on the gate electrode insulating layer;
forming a source electrode metal layer, and forming a pattern including a data line and a source electrode by a fifth patterning process, on the formed pattern including the active layer; and
forming a passivation layer, on the formed pattern including the data line and the source electrode.

4. The fabrication method of the substrate according to claim 3, after the removing the light-shielding layer, further comprising:
forming a via hole corresponding to a drain electrode, on the black matrix and the passivation layer; and
forming a transparent conductive layer, and forming a pattern including a pixel electrode by a sixth patterning process, the pixel electrode being electrically connected with the drain electrode through the via hole.

5. The fabrication method of the substrate according to claim 1, wherein the light-shielding layer is removed by using an etching method.

6. The fabrication method of the substrate according to claim 1, wherein the light-shielding layer is removed by using an etching method.

7. The fabrication method of the substrate according to claim 1, wherein the forming the pattern of the light-shielding layer comprises:
forming a photoresist layer on the light-shielding layer; and
forming the pattern of the light-shielding layer by using a pattern of the photoresist layer.

8. The fabrication method of the substrate according to claim 7, further comprising removing the photoresist layer.

9. The fabrication method of the substrate according to claim 1, wherein the light-shielding layer is made of a metal.

10. The fabrication method of the substrate according to claim 9, wherein the light-shielding layer is removed by using an etching method.

11. A fabrication method of a substrate, comprising:
forming a to-be-treated layer, forming a light-shielding layer on the to-be-treated layer, and forming a pattern of the light-shielding layer by a first patterning process;
performing a second patterning process on the to-be-treated layer by using the pattern of the light-shielding layer as a mask; and
removing the light-shielding layer,
wherein the to-be-treated layer is of a color photosensitive resin, the fabrication method further comprising:
after the second patterning process is performed on the to-be-treated layer by using the pattern of the light-shielding layer as a mask, forming the to-be-treated layer into a color filter layer.

12. The fabrication method of the substrate according to claim 11, wherein the substrate is a color filter substrate, and the fabrication method further comprises:
forming a black matrix on the substrate; and
forming a transparent protective layer on the black matrix and the color filter layer.

13. The fabrication method of the substrate according to claim 11, wherein the substrate is an array substrate,
before the forming the to-be-treated layer, the forming the light-shielding layer on the to-be-treated layer, and the forming the pattern of the light-shielding layer by the first patterning process,
the fabrication method further comprising:
forming a gate electrode metal layer on a base substrate, and forming a pattern including a gate line and a gate electrode by a third patterning process;
forming a gate electrode insulating layer, on the formed pattern including the gate line and the gate electrode;
forming a semiconductor thin film, and forming a pattern including an active layer by a fourth patterning process, on the gate electrode insulating layer;
forming a source electrode metal layer, and forming a pattern including a data line and a source electrode by a fifth patterning process, on the formed pattern including the active layer; and
forming a passivation layer, on the formed pattern including the data line and the source electrode.

14. The fabrication method of the substrate according to claim 11, wherein the light-shielding layer is removed by using an etching method.

15. The fabrication method of the substrate according to claim 11, wherein the light-shielding layer is removed by using an etching method.

16. The fabrication method of the substrate according to claim 11, wherein the forming the pattern of the light-shielding layer comprises:
forming a photoresist layer on the light-shielding layer; and
forming the pattern of the light-shielding layer by using a pattern of the photoresist layer.

17. The fabrication method of the substrate according to claim 11, wherein the light-shielding layer is made of a metal.

18. The fabrication method of the substrate according to claim 17, wherein the light-shielding layer is removed by using an etching method.

* * * * *